United States Patent
Ring

(10) Patent No.: US 6,750,710 B2
(45) Date of Patent: Jun. 15, 2004

(54) DISTORTION REDUCTION

(75) Inventor: Steven Richard Ring, Bristol (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 10/203,049

(22) PCT Filed: Jan. 29, 2001

(86) PCT No.: PCT/GB01/00366

§ 371 (c)(1),
(2), (4) Date: Dec. 9, 2002

(87) PCT Pub. No.: WO01/58008

PCT Pub. Date: Aug. 9, 2001

(65) Prior Publication Data

US 2003/0179042 A1 Sep. 25, 2003

(30) Foreign Application Priority Data

Feb. 1, 2000 (GB) .............................................. 0002321

(51) Int. Cl.⁷ .............................................. H03F 1/26
(52) U.S. Cl. ...................... 330/149; 330/136; 330/107; 327/359
(58) Field of Search ................................. 330/149, 136, 330/107; 327/359

(56) References Cited

U.S. PATENT DOCUMENTS

| 4,462,001 A | | 7/1984 | Girard |
| 5,598,436 A | | 1/1997 | Brajal |
| 5,920,808 A | * | 7/1999 | Jones et al. ............... 455/127.1 |
| 6,112,062 A | | 8/2000 | Hans et al. |
| 6,141,390 A | * | 10/2000 | Cova ........................... 375/297 |
| 6,388,518 B1 | * | 5/2002 | Miyatani .................... 330/149 |

FOREIGN PATENT DOCUMENTS

| EP | 0 378 719 | 7/1990 |
| FR | 2 652 470 A | 3/1991 |
| WO | WO 9917440 | 4/1999 |

* cited by examiner

Primary Examiner—Patricia Nguyen
(74) Attorney, Agent, or Firm—Mendelsohn & Assocs.

(57) ABSTRACT

Phase shifting network (110) predistorts the input to non-linear amplifier (114) to counteract AM-PM distortion. The input signal is sampled at (116) and its amplitude is detected at (118). The amplitude signal is then used to index a lookup table (122) which contains corresponding data for controlling the phase shifting network (110). The input signal may be digital and the phase shifting process may be implemented in the digital domain.

14 Claims, 3 Drawing Sheets

DISTORTION REDUCTION

This invention relates to methods and apparatus for reducing the distortion appearing in an output signal which a signal handling means (such as an amplifier) produces in response to an input signal. In particular, this invention relates to predistorting the phase of an input signal to linearise the output of a signal handling means.

Amplifier predistorters are known in which a predistortion signal is combined with the amplifier input to predistort it in such a way as to counteract distortion imposed upon the input signal by the amplifier itself. Such predistorters may be complex and unsuited to integration.

It is an object of the invention to provide a relatively simple distortion reduction mechanism, such as a predistorter.

According to one aspect, the invention provides distortion reduction apparatus for reducing the distortion appearing in an output signal which a signal handling means produces in response to an input signal, wherein the input signal is provided to the apparatus in a digital format and the apparatus comprises data storage means for storing phase shift data and outputting phase shift data when addressed by the digital magnitude of the input signal and phase shift means for phase shifting the input signal under the control of the phase shift data to produce a predistorted input signal, wherein the phase shift means operates on the input signal in the analogue domain.

According to another aspect, the invention provides a method of reducing the distortion appearing in an output signal which a signal handling means produces in response to an input signal, said input signal being provided in digital format and the method comprising addressing a data storage means using the digital magnitude of input signal such that the data storage means outputs corresponding phase shift data and using the phase shift data to control a phase shift applied to the input signal to produce a predistorted input signal to counteract said distortion, wherein the phase shifting step comprises phase shifting the input signal in the analogue domain.

The distortion reduction scheme according to the invention is advantageously relatively simple. It is flexible because the phase shift data may be re-writable, for example, to cope with changing conditions or for calibration purposes. The invention uses the storage means to apply phase predistortion to the input signal to counteract the phase distortion of the input signal that occurs within the signal handling means. This may lead to a significant beneficial reduction in the AM-PM distortion and reduced spectral re-growth and error vector magnitude (EVM) in the output signal.

Some examples of applications where this approach may be particularly useful, include the linearisation of amplifiers and devices where AM-PM distortion is the dominant distortion mechanism and for certain modulations, where the control of phase distortion is particularly important.

Digital magnitude values of the input signal are used to address the storage means, resulting in an implementation particularly suited to integration.

Certain embodiments of the invention operate on analogue input signals. Such embodiments use an amplitude detector to measure the instantaneous amplitude of the input signal, this amplitude signal being used to address the storage means.

In a preferred embodiment, the storage means is a lookup table, which stores data corresponding to desired phase shift means control signals, the data being addressed by the corresponding input signal amplitude values. In general, lookup tables can be rewritten to adapt the predistortion to new operating parameters.

By way of example only, certain embodiments of the invention will now be described with reference to the accompanying figures, in which.

Figure 1:
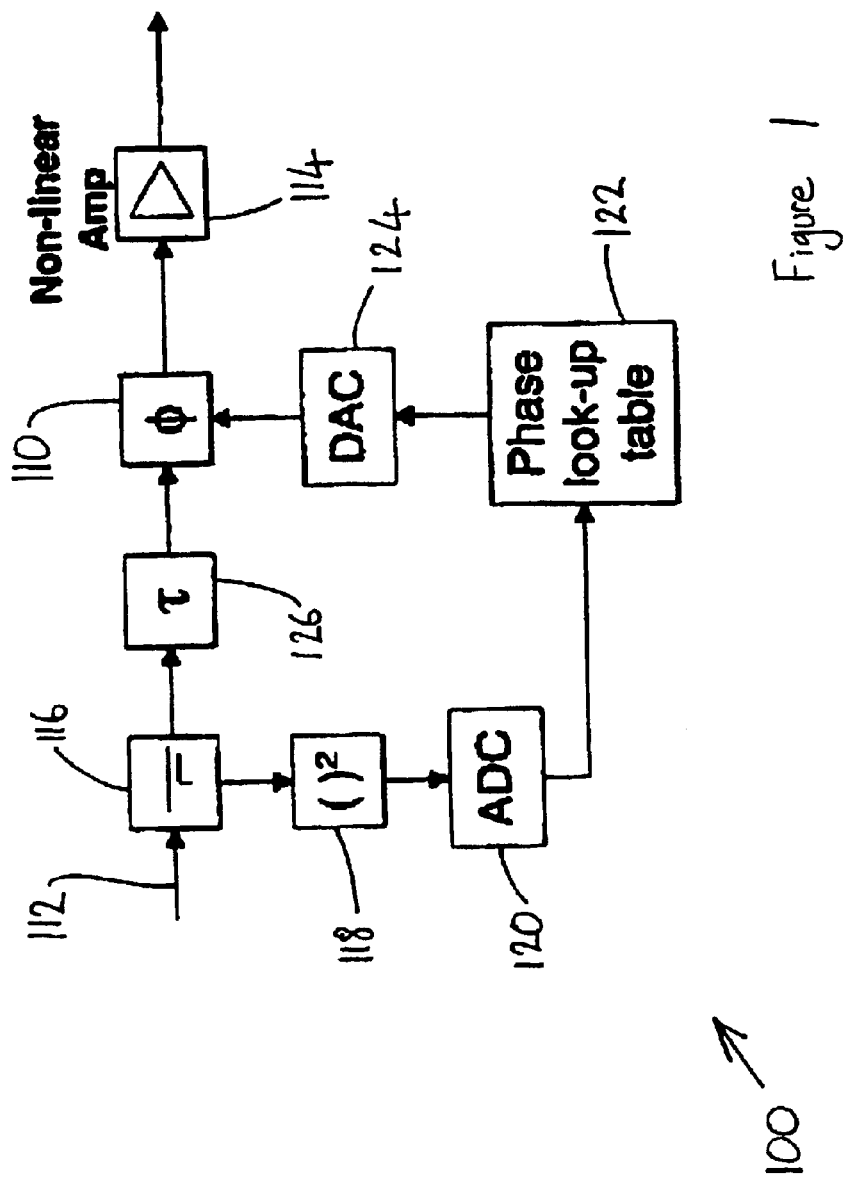
FIG. 1 illustrates schematically a predistortion scheme for a non-linear amplifier.
Figure 2:
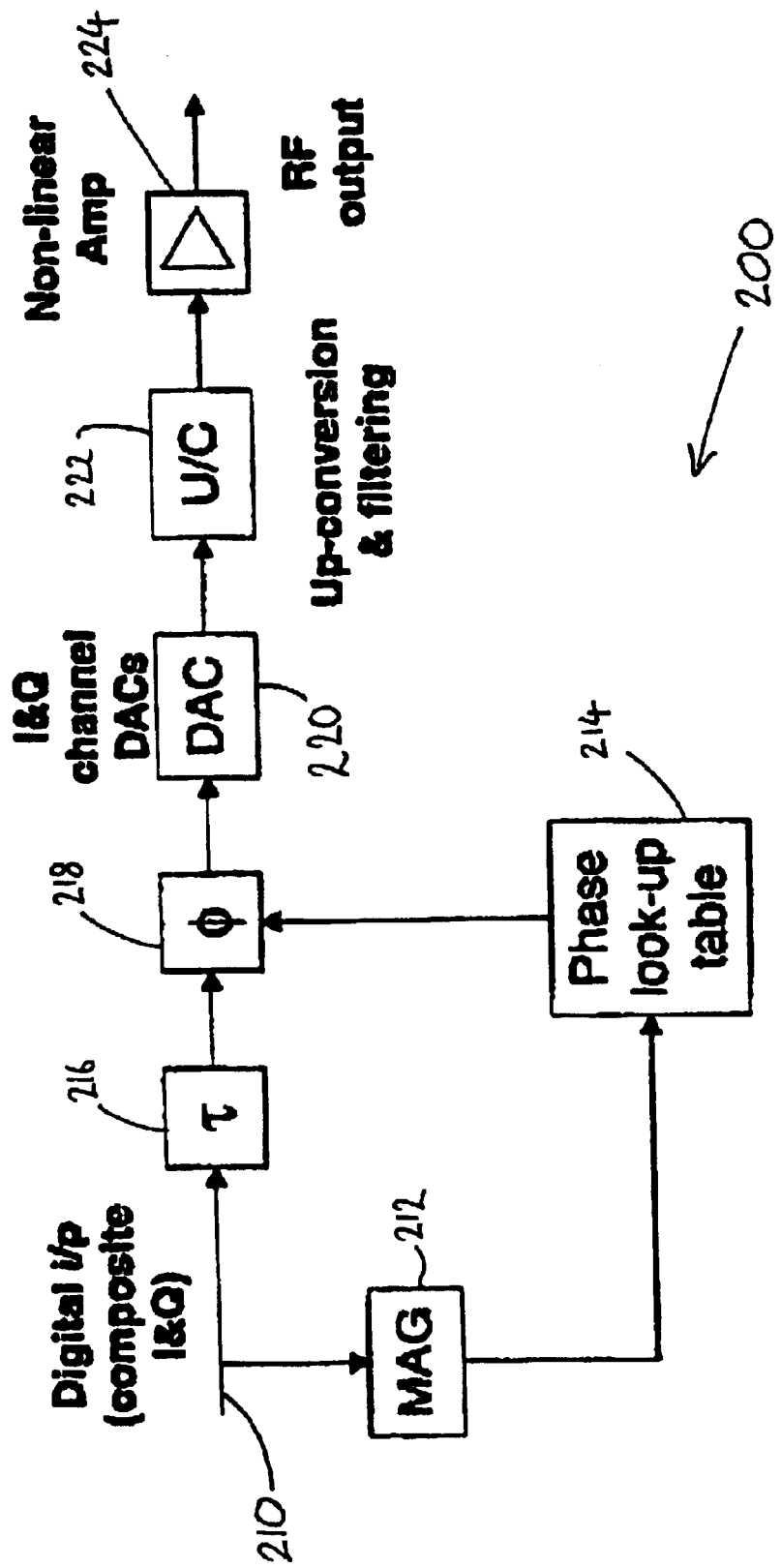
FIG. 2 illustrates schematically another predistortion scheme for a non-linear amplifier.
Figure 3:
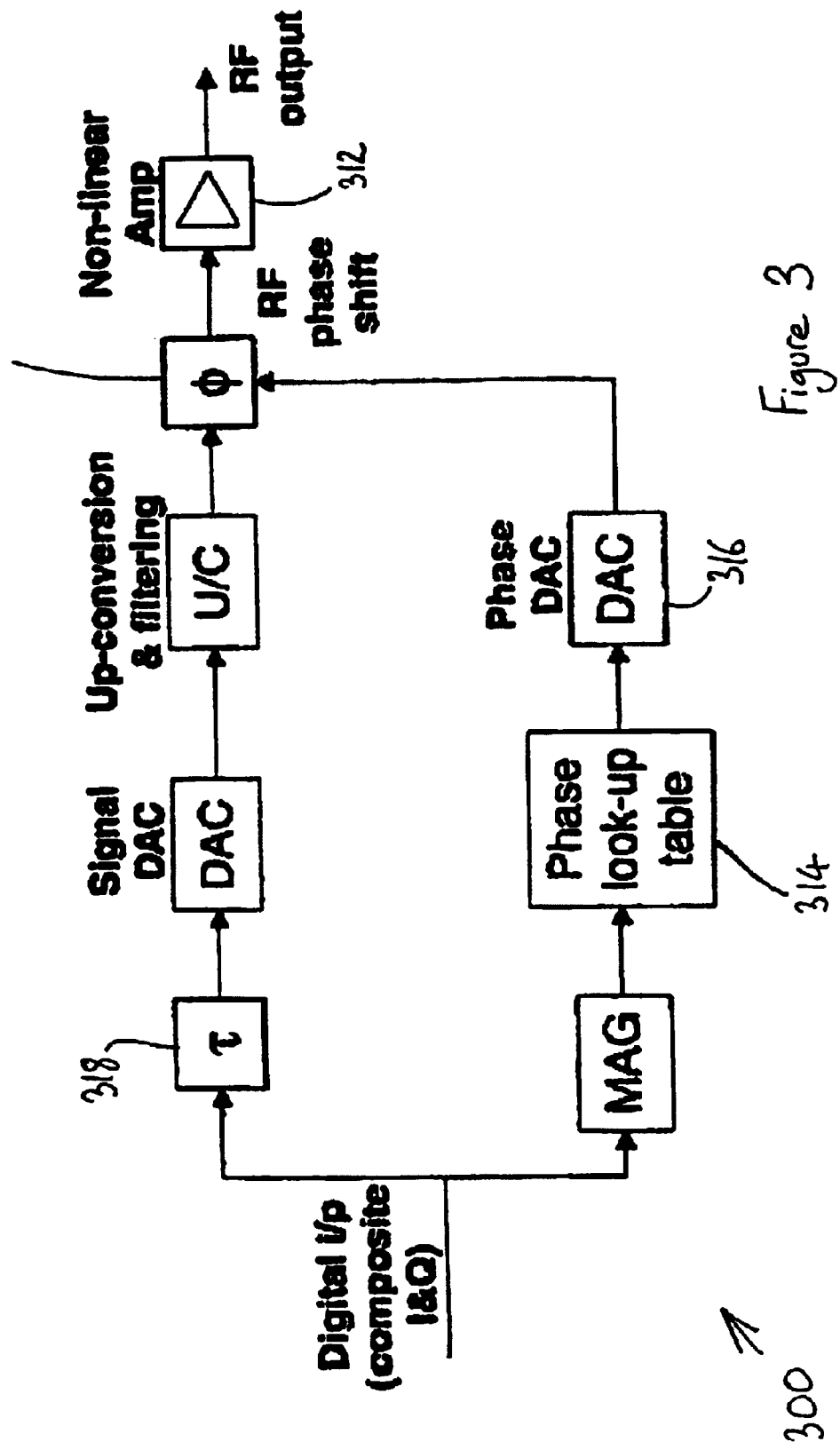
FIG. 3 illustrates schematically a predistortion scheme for a non-linear amplifier which embodies the invention.

FIGS. 1 to 3 each illustrate schematically a predistortion scheme for a non-linear amplifier.

The predistorter 100 of FIG. 1 comprises a phase shift network 110 predistorting the input signal 112 to a non-linear amplifier 114. The amplifier 114 distorts the phase of the incoming signal according to the instantaneous amplitude value of the input signal. This kind of distortion is called AM-PM distortion. The phase shift network 110 is controlled to provide an appropriate counter-distortion to the input signal 112 to linearise such AM-PM distortion.

Predistorter 100 includes a means of detecting the instantaneous amplitude of the incoming signal, as sampled from coupler 116. In predistorter 100, the amplitude detector comprises a squarer 118 for squaring the sampled input signal to generate the necessary input amplitude information. The input amplitude information is the digitised using ADC 120 and used to address a lookup table (LUT) 122.

The LUT contains certain phase rotation values corresponding to certain input amplitude values, approximating as close as possible to the inverse of the amplitude to phase response of amplifier 114. The phase shift values produced by LUT 122 are converted back to an analogue voltage using DAC 124 and applied to voltage controlled phase shifting network 110. Thus, the phase of the RF input signal 112 is predistorted in such a way that the combination of the phase predistortion and the AM-PM distortion within amplifier 114 itself gives an output signal with much reduced AM-PM distortion, i.e. the output signal has been linearised. The predistorter 100 is especially useful for improving the linearity of an existing single carrier RF amplifier.

The delay through the data converters 120, 124 in the predistortion path limits the bandwidth towards single carrier power amplifier (SCPA) applications if no time delay is used. This limitation can be overcome by using an analogue delay 126 between coupler 116 and the phase shifting network 110. However, the analogue delay 126 may be bulky and cause problems in the volume production of the predistorter, leading to extra costs.

The predistorter 200 of FIG. 2 avoids the use of an analogue compensating delay. The input signal 210 to predistorter 200 is a digital, quadrature format signal. The input signal may consist of a single or multi-carrier signal. The instantaneous amplitude of the input signal is detected at 212 and used to address LUT 214, which, as with predistorter 100, outputs control data for the phase shifting operation. In predistorter 200, both the compensating delay 216 and the phase shifting process 218 are implemented in the digital domain, for example, using a DSP. Phase shifting process 218 predistorts the digital input signal 210 which is then converted to an analogue signal by DAC 220. The analogue, predistorted input signal is then, at 222, up-converted to the RF band and filtered to reject unwanted components of the up-conversion process. The RF, phase-predistorted input signal is then fed to the non-linear amplifier 224.

Predistorter 200 is advantageous because it permits a higher level of integration with fewer discrete components which results in a lower cost and better repeatability and fewer adjustments in production. Further, this implementation is better suited to multi-carrier linear amplifier products than the RF input, RF output approach of predistorter 100. Also, it is relatively easy to introduce an accurate digital time delay using digital signal processing techniques in order to compensate for the access time of the lookup table as compared to the difficulty and production issues connected with the analogue delay line of predistorter 100.

However, certain drawbacks apply to phase predistorters like that shown at 200. If, as is often the case, the predistortion process using phase shift process 218 introduces distortion components into the input signal which have a wider bandwidth than the wanted signal (i.e. the original input signal), then the effectiveness of the phase predistortion will be limited by the restricted bandwidth of ADCs, DACs, filters and other components in the signal path. Alternatively, these components may be prohibitively expensive if they are redesigned to handle the bandwidth of the phase predistortion products. Wideband phase predistortion components may be aliased by the main signal DAC 220 and may actually add to the distortion of the output signal rather than reduce it as was intended. AM-PM distortion introduced by predistorter 200 prior to DAC 220 may also cause unnecessary extra distortion in the signal path between the DAC 220 and the amplifier 224.

The predistorter shown in FIG. 3 is similar in many ways to predistorter 200 and hence only the important differences will now be described. Predistorter 300 avoids some of the drawbacks of predistorter 200. The phase predistortion is now applied to the input signal using an RF phase shifting network 310 immediately before the amplifier 312 undergoing linearisation. This means that the phase shift control data from LUT 314 must be converted into an analogue signal. This is achieved by DAC 316 in a manner similar to DAC 124 in FIG. 1.

Predistorting the input signal just before the amplifier 312, where it is actually needed, provides additional advantages. For example, the predistorter 300 achieves better cancellation of AM-PM distortion principally because the wideband components of the predistortion signal are applied immediately before the non-linear amplifier 312. This prevents the predistortion signals from being reduced in effectiveness through distortion or band limitation in the up-conversion path. Other benefits are that lower specification and or integrated DACs can be used in the main signal and the predistortion signal paths to save costs, and the compensating time delay 318 can be implemented digitally as before.

With reference to the delay elements 126, 216 and 318 used in the above described embodiments, it should be appreciated that the time delays of the main signal path (including the phase shifting means) and the control path (including the LUT) should be controlled depending upon the bandwidth required from the predistortion technique. Therefore, the time delay may be needed in either the main signal path or the control path.

What is claimed is:

1. Distortion reduction apparatus for reducing the distortion appearing in an output signal which signal handling equipment produces in response to an input signal, wherein the input signal is provided to the apparatus in a digital format and the apparatus comprises data storage for storing phase shift data and outputting phase shift data when addressed by the digital magnitude of the input signal and a phase shifter for phase shifting the input signal under the control of the phase shift data to produce a predistorted input signal, wherein the phase shifter operates on the input signal in the analogue domain.

2. Apparatus according to claim 1, further comprising a frequency converter for frequency converting the input signal, wherein the phase shifter operates on the input signal subsequent to the frequency converter.

3. Apparatus according to claim 1, wherein the phase shifter operates on the input signal immediately prior to the signal handling equipment.

4. Apparatus according to claim 1, further comprising a delay arranged to time-align the input signal and the phase shift data at the phase shifter.

5. Apparatus according to claim 1, wherein the phase shifter comprises a phase shifting network.

6. Apparatus according to claim 1, wherein the storage comprises a look-up table.

7. Apparatus according to claim 1, wherein the signal handling equipment is an amplifier.

8. A method of reducing the distortion appearing in an output signal which signal handling equipment produces in response to an input signal, said input signal being provided in digital format and the method comprising addressing data storage using the digital magnitude of input signal such that the data storage outputs corresponding phase shift data and using the phase shift data to control a phase shift applied to the input signal to produce a predistorted input signal to counteract said distortion, wherein the phase shifting step comprises phase shifting the input signal in the analogue domain.

9. A method according to claim 8, further comprising the step of frequency converting the input signal and wherein the phase shift is applied after the frequency conversion of the input signal.

10. A method according to claim 8, wherein the phase shift is applied immediately prior to the signal handling equipment receiving the input signal.

11. A method according to claim 8, further comprising time-aligning the input signal and the phase shift data at the point of application of the phase shift to the input signal.

12. A method according to claim 8, wherein the phase shifting step comprises performed using a phase shifting network.

13. A method according to claim 8, wherein the storage comprises a look-up table.

14. A method according to claim 8, wherein the signal handling means is an amplifier.

* * * * *